(12) United States Patent
Kung et al.

(10) Patent No.: US 6,695,040 B1
(45) Date of Patent: Feb. 24, 2004

(54) THIN PLANAR HEAT DISTRIBUTOR

(75) Inventors: Moriss Kung, Hsin Tien (TW);
Kwun-Yao Ho, Hsin Tien (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/326,148

(22) Filed: Dec. 23, 2002

(30) Foreign Application Priority Data

Oct. 4, 2002 (TW) ........................................ 91215821 U

(51) Int. Cl.[7] ............................................. F28D 15/00
(52) U.S. Cl. ............................ 165/104.26; 165/104.21; 361/700; 174/15.2
(58) Field of Search ........................ 165/104.26, 104.21, 165/104.33, 185; 361/700; 174/15.2; 257/715

(56) References Cited

U.S. PATENT DOCUMENTS

| | | | | |
|---|---|---|---|---|
| 4,602,679 A | * | 7/1986 | Edelstein et al. | 165/104.26 |
| 5,725,049 A | * | 3/1998 | Swanson et al. | 165/104.26 |
| 6,164,368 A | * | 12/2000 | Furukawa et al. | 165/104.33 |
| 6,167,948 B1 | * | 1/2001 | Thomas | 165/104.26 |
| 6,601,643 B2 | * | 8/2003 | Cho et al. | 165/104.26 |

\* cited by examiner

*Primary Examiner*—Terrell Mckinnon
(74) *Attorney, Agent, or Firm*—Troxell Law Office PLLC

(57) ABSTRACT

A thin planar heat distributor is introduced to include a foil-like plate having a top surface with a channel pattern and an overlapping part for sealing the top surface. The channel pattern presents a radiation-and-interval arrangement and includes a plurality of fluid-conveying channels and vapor-diffusing channels. The fluid-conveying channels are formed by capillary structures for transporting the condensed fluid throughout the distributor. By providing a thinner and broader heat-absorption area and the channel pattern, the distributor can thus provide both rapid heat diffusion and installation flexibility.

20 Claims, 13 Drawing Sheets

THIN PLANAR HEAT DISTRIBUTOR

FIELD OF THE INVENTION

The present invention relates to a thin planar heat distributor, more particularly, to an ultra thin planar heat dissipation structure of heat pipes.

BACKGROUND OF THE INVENTION

With promotion of electronic components and equipment functions, the working power thereof is getting greater and the size thereof becomes more compact and lighter. Such a development makes a further requirement for the speed and energy of heat dissipation of the electronic components and the electronic apparatuses.

In the heat dissipating application of the electronic equipment, the common heat dissipating modes have a heat pipe installation, a heat dissipating fin installation and a forced-flow fan installation. However, these three heat dissipating modes become a bottleneck of the trend to component power and compact size for modern equipment.

Taking example by the heat dissipating mode of traditional tube-type or loop-type heat pipe installation, it has the advantages of rapid heat conduction and leading the absorbed heat to a certain direction, but it has the problems of difficult arrangement and small heat absorbing area etc. due to the structural characteristics of the heat pipe itself and restrictions on extending and bending. Hence, such a heat dissipating mode for components of high power needs arrangement of more heat pipes, which obviously violates the requirement for compact size of the machine.

Furthermore, taking example by the heat dissipating mode of heat dissipating fin installation, if the heat dissipation fins are installed at the periphery of the electronic equipment, more heat dissipating energy can be provided by means of the mass and surface, but the heat dissipating operation for the heat producing components of high power in machines is less benefited. If the heat dissipation fins are installed directly on the heat producing components, the heat produced by the components can rapidly conducted out, but this heat exchange mechanism is only to release the produced heat directly into the machines and has ill influences on the peripheral electronic components, and the installation of the heat dissipation fins occupying a certain room in the heat producing components is apparently difficult to achieve the requirement for the compact size of the machine.

Still, taking example by the heat dissipating mode of installing the forcing air current fan in the equipment or on the side thereof, an accelerating air current field is produced in the environment of the electronic components so as to rapidly remove the heat in the machine, but the heat produced from the operation of the fan itself becomes an obvious negative factor for the heat dissipation of the machine. Moreover, a much larger space is needed for installing the fan, and a sufficient air current field in the machine is also needed to result in a preferred heat dissipating effect. Apparently, the installation of the fan cannot satisfy the requirement for the compact size of the machine.

Therefore, the industry is eager to find out the ways to rapidly send out the produced heat in the electronic equipment, especially a compact machine, so as to prevent accumulation of the heat energy in the machine, which leads to reduction of the performance of electronic components or even breakdown.

SUMMARY OF THE INVENTION

The primary objective of the present invention is to provide a thin planar heat distributor to obtain the simultaneous effects of rapid heat conduction, heat dissipation and ready arrangement by means of the wide heat absorbing and dissipating faces thereof as well as the extremely thin configuration thereof.

The thin planar heat distributor of this invention includes a channel portion and an overlapping part for sealing the channel portion.

The channel portion can be a foil-like plate which has a top channel surface and a corresponding outer face. A plurality of fluid-conveying channels and vapor-diffusing channels in a predetermined radiation-and-interval arrangement are formed by a manufacturing manner on the top channel surface of the channel portion. Corresponding capillary structures are set in each fluid-conveying channel and the intersection of the fluid-conveying channels in the predetermined radiation-and-interval arrangement of this invention is the main heat absorption location of the thin planar heat distributor.

The top channel surface of the channel portion is sealed by the overlapping part so that the fluid-conveying channels and the vapor-diffusing channels on the channel portion form together to be a closed radiative channel network structure.

In this invention, a certain quantity of volatile fluid is added in the closed channel network structure. When a heat producing component is set at the heat absorption location of the thin planar heat distributor, the heat produced by the heat producing component is absorbed by the channel portion through heat conduction. The absorbed heat evaporates the fluid in the closed channel network structure to form a vapor, and the vapor is transported away from the heat absorption location through the radiative vapor-diffusing channels. The vapor far away from the heat absorption location can be heat exchanged with the surroundings through the channel portion or the overlapping part to release the heat, and the metal materials of the portion of the non-fluid-conveying channels and the non-vapor-diffusing channels can increase the effect on heat dissipation. Thus, the vapor can be condensed to form a liquid. The liquid is transported back to the original heat absorption location by means of the capillary structures in the fluid-conveying channels to carry out another heat exchange circulation.

In one of the examples of this invention, an indenting and protruding structure is further formed on the outer face of the channel portion so as to broaden the heat exchange area of the outer face. Preferably, the surface of the indenting and protruding structure can be roughened.

In one of the examples of this invention, an indenting and protruding structure is further formed on the outer face of the channel portion so as to broaden the heat exchange area of the outer face. Preferably, the surface of the indenting and protruding structure can be roughened.

In one of the examples of this invention, the top channel surface of the thin planar heat distributor can also be a structure treated by roughening so as to broaden the fluid contacting area on the top channel surface.

In one of the examples of this invention, a capillary structure block can be accumulated at the heat absorption location of the thin planar heat distributor to construct a fluid concentration region of the fluid-conveying channels.

In this invention, the channel portion of the thin planar heat distributor can be fabricated by etching, electroplating, punching, casting, cutting, printing or other methods suitable for forming channels on a thin plate.

In this invention, the channel portion of the thin planar heat distributor can be a copper foil, an aluminum foil or other heat conducting thin sheet. The overlapping part can be a copper foil, an aluminum foil, a metallic sheet, a housing sheet, or other planar structures being able to seal the top channel surface of the channel portion.

In this invention, the capillary structure in the fluid-conveying channels of the channel portion of the thin planar heat distributor can be a sintering article of metallic powders, a ceramic water-absorbing article or other porous materials being able to provide a capillary transporting function.

In one of the examples of this invention, the predetermined radiation-and-interval arrangement of the thin planar heat distributor for constructing the fluid-conveying channels and the vapor-diffusing channels includes at least one radiative network structure. Each of the radiative network structures further includes corresponding fluid-conveying channels and vapor-diffusing channels. The intersection in each radiative network structure is a heat absorbing location. Preferably, each of the radiative network structures is at least connected with another radiative network structure by at least one fluid-conveying channel, thereby the fluids between the radiative network structures can interflow.

In one of the examples of this invention, the channel portion of the thin planar heat distributor further includes at least one outer ring channel which is disposed outside the heat absorbing location and is used to connect at least two fluid-conveying channels. Preferably, capillary structures are set in the outer ring channel.

In one of the examples of this invention, the channel portion of the thin planar heat distributor further includes at least one outer ring channel which is disposed outside the heat absorbing location and is used to connect at least two vapor-diffusing channels.

In one of the examples of this invention, the channel portion of the thin planar heat distributor further includes a fluid-conveying channel entrance in connection with at least one of the fluid-conveying channels and a vapor-diffusing channel entrance in connection with at least one of the vapor-diffusing channels. By means of the fluid-conveying channel entrance and the vapor-diffusing channel entrance, a plurality of the thin planar heat distributors of this invention can be employed to make a convenient heat dissipating combination.

The heat dissipating combination of this invention includes at least one pair of thin planar heat distributors, wherein the corresponding two fluid-conveying channel entrances in each pair of the thin planar heat distributors are connected with each other by a fluid return channel and the corresponding two vapor-diffusing channel entrance thereof are connected with each other by a vapor duct, thereby the vapor and fluid of each pair of the thin planar heat distributors can interflow.

In one of the examples of the heat dissipating combination of this invention, the vapor duct for connecting the two vapor-diffusing channel entrances can be an adiabatic duct structure.

In one of the examples of the heat dissipating combination of this invention, the fluid return channel for connecting the two fluid-conveying channel entrances can have a capillary structure therein. The capillary structure is preferably a sintering article of metallic powders.

In one of the examples of the heat dissipating combination of this invention, at least two of the corresponding fluid return channels of the respective pairs of the thin planar heat distributors are intersected to form a fluid co-reservoir.

In this invention, the fluid-conveying channel and the vapor-diffusing channel can be combined to form a single channel, wherein the vapor-diffusing channel is preferably arranged in the middle of the fluid-conveying channel.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The detailed description of a thin planar heat distributor in accordance with this invention is given for illustration by the following preferred embodiments. Those elements with the same functions except different configurations are denominated with the same name and are marked with the same numeral so as to facilitate consistency in explanation of the invention.

Figure 1A:
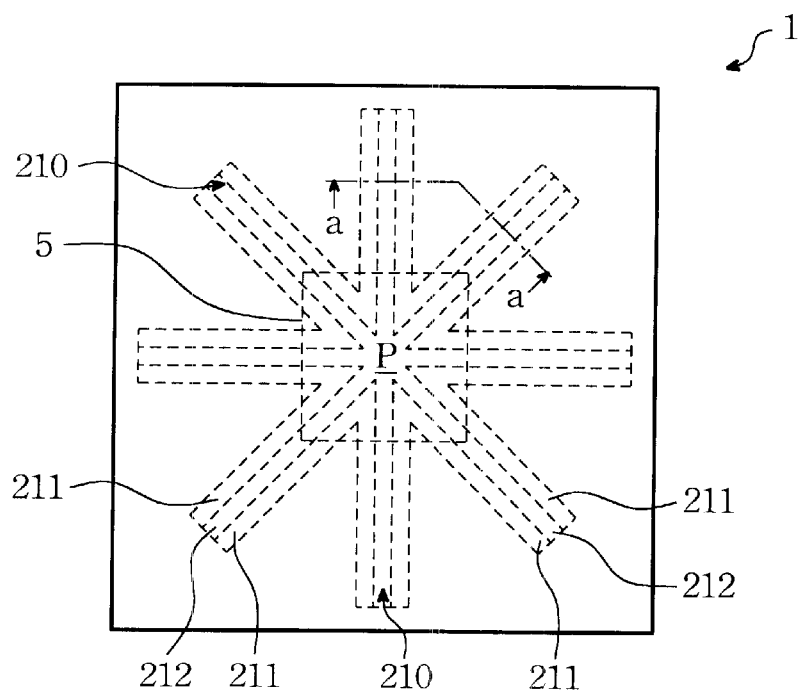
FIG. 1A is a schematic diagram of a first embodiment of the thin planar heat distributor in accordance with this invention, in a top view.
Figure 1B:
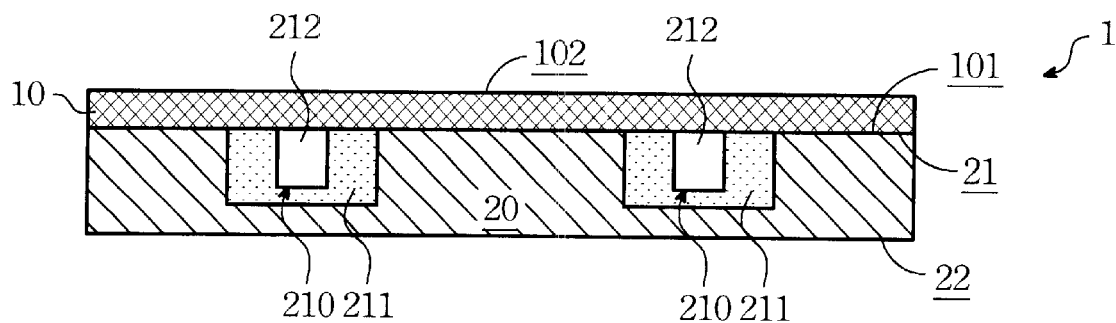
FIG. 1B is a schematic section view of FIG. 1A along a sectional line aa.

Please refer to FIGS. 1A and 1B, which are schematic diagrams of a first embodiment in accordance with this invention, respectively in a top view and in a sectional view along a section line aa. The thin planar heat distributor 1 of this invention includes a channel portion 20 and an overlapping part 10 for sealing the channel portion 20.

The channel portion 20 can be a foil-like plate which has a top channel surface 21 and a corresponding outer face 22. A plurality of channels 210 in a predetermined radiation-and-interval arrangement are formed by a manufacturing manner on the top channel surface 21 of the channel portion 20. Each channel 210 further includes a fluid-conveying channel 211 formed by capillary materials and a vapor-diffusing channel 212 disposed in the fluid-conveying channel 211.

The top channel surface 21 of the channel portion 20 is sealed by a bottom surface 101 of the overlapping part 10 so that the respective channels 210 (including the fluid-conveying channels 211 and the vapor-diffusing channels 212) in the channel portion 20 form together to be a closed radiative channel network structure.

As shown in FIG. 1A, an intersection P is formed because of the channels 210 in the predetermined radiation-and-interval arrangement. A heat absorption location 5 for contacting a heat producing component is set at the outer face 22 of the channel portion 20 corresponding to the intersection P. Certainly, in the practice of the overlapping part 10 being a heat conductive material, where a top surface 102 of the overlapping part 10 corresponds to the intersection P is also another heat absorption location 5 at which a heat producing component can be set.

The so-called "predetermined radiation-and-interval arrangement" model of the channels 210 in this invention can be a linear radiative shape as shown in FIG. 1A. In other examples, the model can be a curve, a symmetrical loop, a rose curve (rhodonea), or other similar radiative shapes having a central symmetrical characteristic.

In this invention, a certain quantity of volatile fluid (not shown) is added in the network structure formed by the channels 210. When a heat producing component is set at the heat absorption location 5 of the thin planar heat distributor 1, the heat produced by the heat producing component is absorbed by the channel portion 20. The heat is transferred to evaporate the fluid to form a vapor and the vapor is transported away from the heat absorption location 5 by means of the vapor pressure and diffusion in the vapor-diffusing channels 212. After the fluid in a vapor form is heat exchanged with the surroundings far away from the heat absorption location 5 (i.e. the fringe portions of the thin planar heat distributor 1) to release the heat, the vapor is condensed to form a liquid. The liquid is transported back to the original heat absorption location 5 by means of the capillary structures in the fluid-conveying channels 211 of the channels 210. By means of fluid phase change circulation in the channels 210, vapor pressure diffusion of the vapor-diffusing channels 212 and capillary transportation of the capillary structures in the fluid-conveying channels 211, this invention can effectively and rapidly diffuse the heat produced by the heat producing component.

In this invention, when fabricating the thin planar heat distributor 1, a considerably extent of a vacuum state can be formed in the channels 210 not only to ensure the close combination of the overlapping part 10 and the channel portion 20, but also to facilitate the phase transformation of the fluid.

Figure 2A:
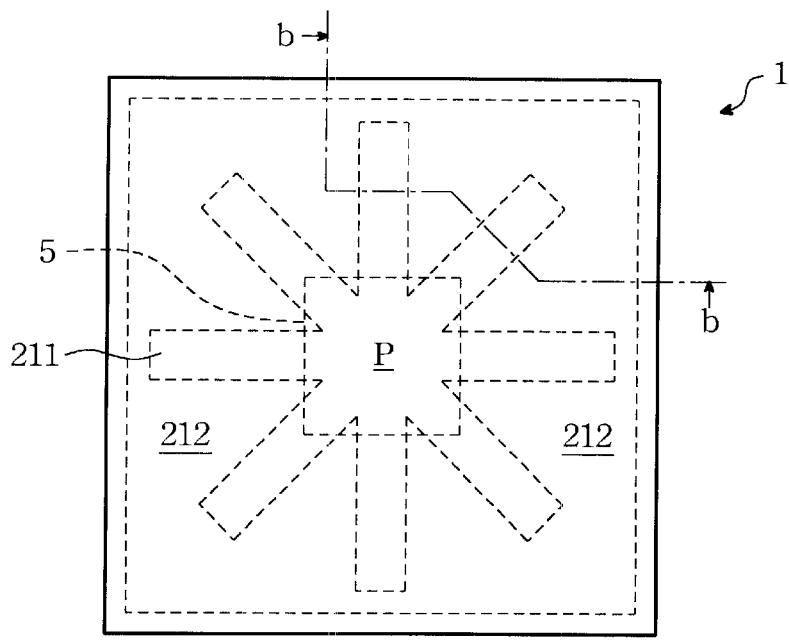
FIG. 2A is a schematic diagram of a second embodiment of the thin planar heat distributor in accordance with this invention, in a top view.
Figure 2B:
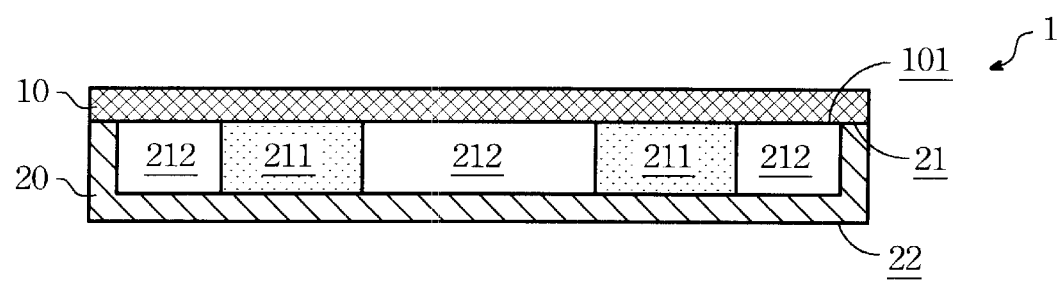
FIG. 2B is a schematic section view of FIG. 2A along a sectional line bb.

Referring to FIGS. 2A and 2B, schematic diagrams of a second embodiment in accordance with this invention, respectively in a top view and in a sectional view along a section line bb are illustrated. The thin planar heat distributor 1, the same as the first embodiment, also includes a channel portion 20 and an overlapping part 10 for sealing the channel portion 20.

In the second embodiment, the channel portion 20 also is a foil-like plate having a top channel surface 21 and a corresponding outer face 22. However, the difference of the second embodiment from the first embodiment lies in that the fluid-conveying channel 211 and the vapor-diffusing channel 212 are reversely arranged by a topology concept in the same space of the thin planar heat distributor 1, that is, the fluid-conveying channel 211 in the first embodiment is arranged at the outer rim of the vapor-diffusing channel 212, but in the second embodiment, the vapor-diffusing channel 212 is reversely arranged at the outer rim of the fluid-conveying channel 211. Hence, the channel portion 20 in the second embodiment includes a plurality of fluid-conveying channels 211 in a predetermined radiation-and-interval arrangement and vapor-diffusing channels 212 which space wraps the fluid-conveying channels 211 up. Each of the fluid-conveying channels 211 also has a corresponding capillary structure. Similarly, an intersection P formed by each of the radiative fluid-conveying channels 211 in the center part of the channel portion 20 is the main heat absorbing location 5 of the thin planar heat distributor in this invention. The employed heat diffusion principle and the application of the heat absorbing location 5 in the second embodiment is identical to those in the aforesaid first embodiment, and thus will not be reiterated herein.

A concave and raised structure (not shown) can be formed on the outer face 22 of the channel portion 20 of the thin planar heat distributor 1 or on the top surface 102 of the overlapping part 10 so as to broaden the heat exchange area of the outer face 22 or of the top surface 102. Preferably, the surface of such a concave and raised structure can have a roughed treatment to provide a more preferred heat exchange area.

Figure 3:
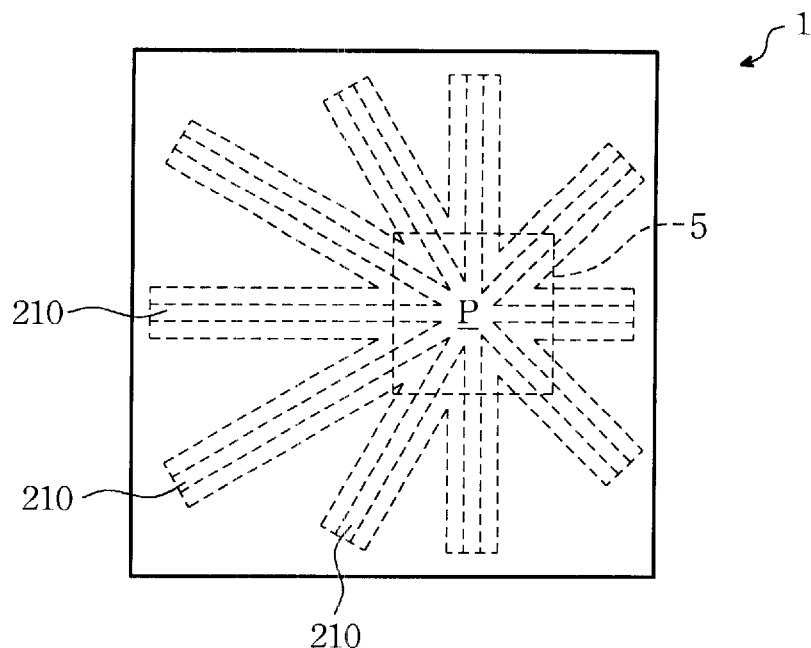
FIG. 3 is a schematic diagram of a third embodiment of the thin planar heat distributor in accordance with this invention, in a top view.

In the first and second embodiments of this invention, the intersection P of the channels 210 or of the fluid-conveying channels 211 and the heat absorbing location 5 for contacting with the heat producing component are set at the center of the heat distributor 1. However, in the practice of this invention, the intersection P and the heat absorbing location 5 may be appropriate adjusted depending on the position of the heat producing component in the arranged space, and are not necessary to be set at the center of the arranged space. For instance, in a third embodiment of this invention derived from the first embodiment, as shown in FIG. 3, the intersection P and the heat absorbing location 5 are set at a right side of the heat distributor 1.

Figure 4A:
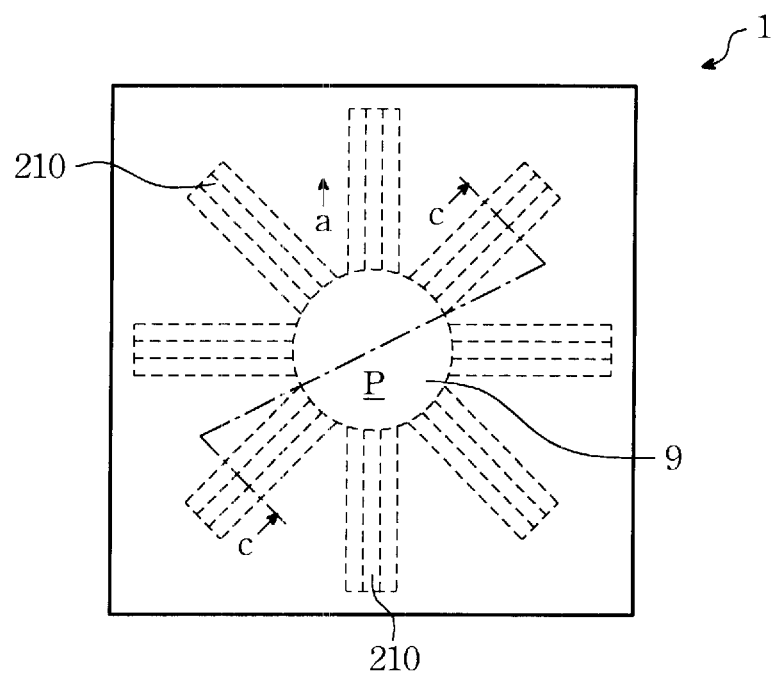
FIG. 4A is a schematic diagram of a fourth embodiment of the thin planar heat distributor in accordance with this invention, in a top view.
Figure 4B:
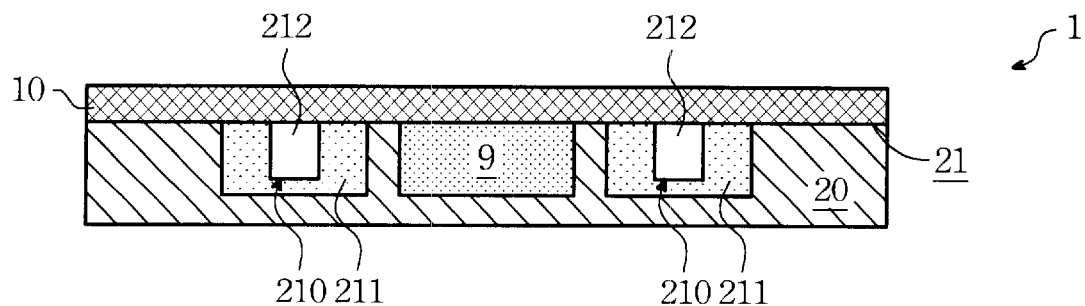
FIG. 4B is a schematic section view of an embodiment of FIG. 4A along a sectional line cc.
Figure 4C:
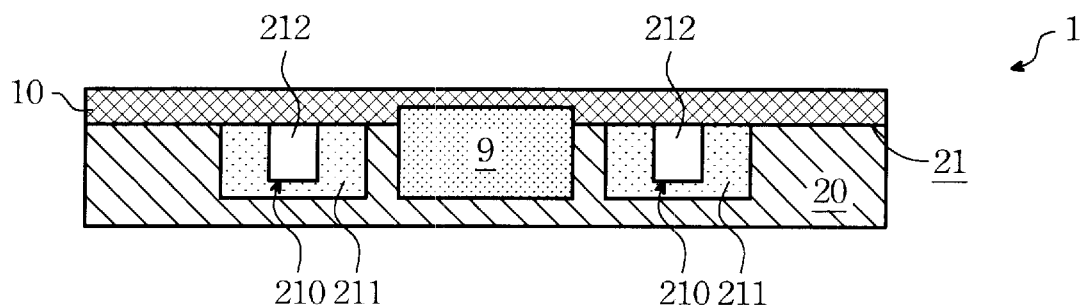
FIG. 4C is a schematic section view of another embodiment of FIG. 4A along a sectional line cc.

Furthermore, referring to FIGS. 4A and 4B, schematic diagrams of a fourth embodiment in accordance with this invention, respectively in a top view and in a sectional view along a section line cc are illustrated. The difference between the fourth embodiment and the first, third embodiments resides in that more capillary structures or blocks of porous materials are accumulated at the center o the thin planar heat distributor 1 (i.e. the intersection P of the channels 210) to construct a main fluid concentration region 9. In FIG. 4B, the level of the fluid concentration region 9 is arranged equal to the channel surface 21 of the channel portion 20. In other examples, the level of the fluid concentration region 9 can be arranged lower than or extending out from the channel surface 21 of the channel portion 20. In FIG. 4C illustrating another schematic diagram of this invention in a sectional view along a section line cc, the level of the fluid concentration region 9 is arranged higher than the channel surface 21, that is, the material on the corresponding overlapping part 10 is removed to receive the protruding capillary structure material.

Figure 5A:
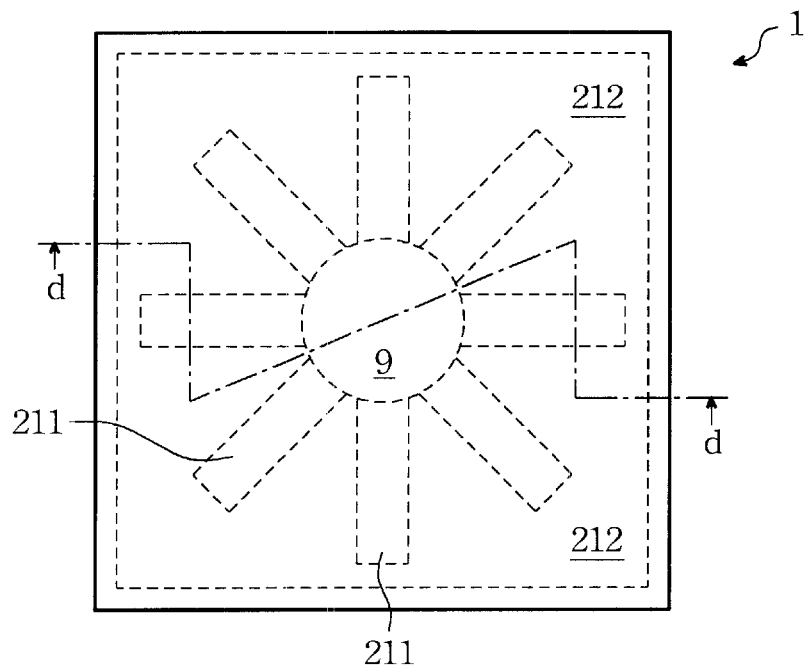
FIG. 5A is a schematic diagram of a fifth embodiment of the thin planar heat distributor in accordance with this invention, in a top view.
Figure 5B:
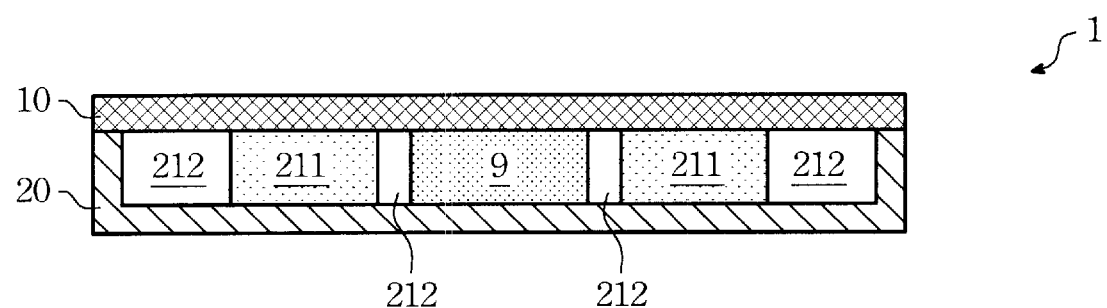
FIG. 5B is a schematic section view of FIG. 5A along a sectional line dd.

Please refer to FIGS. 5A and 5B, which are schematic diagrams of a fifth embodiment in accordance with this invention, respectively in a top view and in a sectional view along a section line dd. The difference between the fifth embodiment and the second embodiment resides in that more capillary structures or blocks of porous materials are accumulated at the center o the thin planar heat distributor 1 (i.e. the intersection P of the fluid-conveying channels 211) to construct a main fluid concentration region 9. Similarly, the level of the fluid concentration region 9 cab be arranged equal to, lower than or extending out from the channel surface 21 of the channel portion 20.

In the above-mentioned embodiments, the channel portion 20 of this invention merely has one heat absorbing location 5. However, according to the design concept of this invention, the thin planar heat distributor 1 of this invention can have a plurality of heat absorbing locations 5 for simultaneously carrying out heat exchange operations of the heat absorbing components at the plurality of the different locations.

Figure 6:
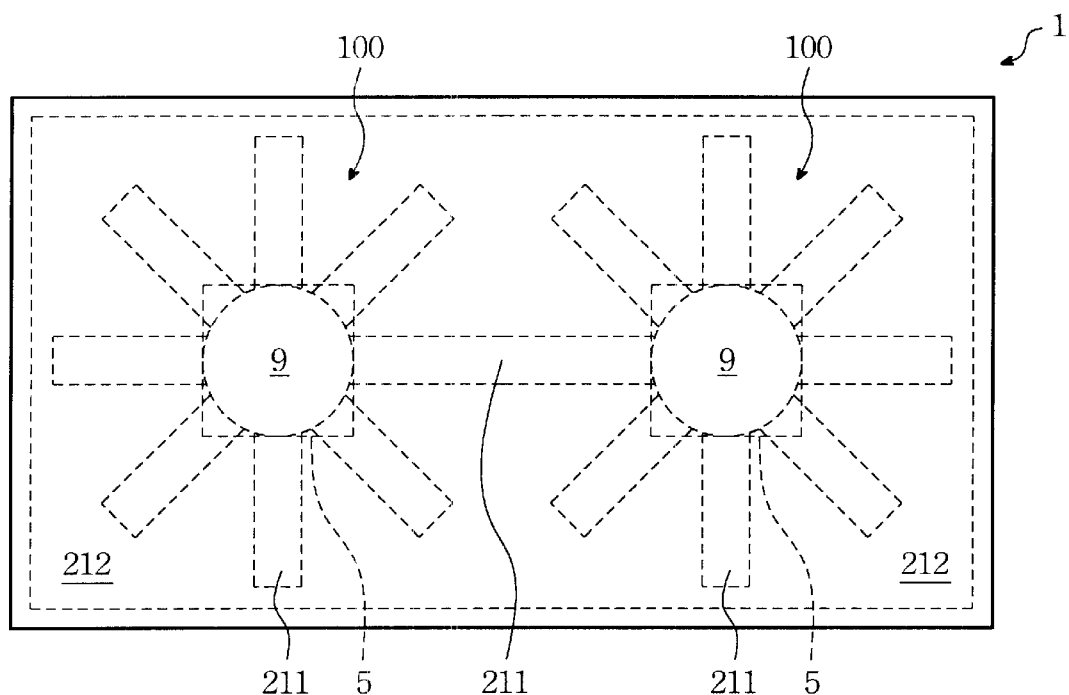
FIG. 6 is a schematic diagram of a sixth embodiment of the thin planar heat distributor in accordance with this invention, in a top view.

Please refer to FIG. 6, which is a schematic diagram of a sixth embodiment of the thin planar heat distributor 1 in accordance with this invention in a top view. The predetermined radiation-and-interval arrangement of this invention for constructing the fluid-conveying channels 211 and the vapor-diffusing channels 212 includes at least one radiative network structure 100 (two radiative network structures 100 are shown in FIG. 6). Each of the radiative network structures 100 further includes corresponding fluid-conveying channels 211 and vapor-diffusing channels 212. The intersection in each radiative network structure 100 is a heat absorbing location 5. In this preferred embodiment, each of the intersections is formed as a fluid concentration region 9 and each of the radiative network structures 100 is at least connected with another radiative network structure 100 by at least one fluid-conveying channel 211(one fluid-conveying channel 211 is shown in FIG. 6), thereby the fluids between the radiative network structures 100 can interflow.

In the sixth embodiment of FIG. 6, the vapor-diffusing channels 212 are arranged by wrapping the fluid-conveying channels 211 up (e.g. the second and fifth embodiments). In other embodiments, the construction of the channels 210 in the first, third and fourth embodiments can also be employed therein (not shown).

Figure 7:
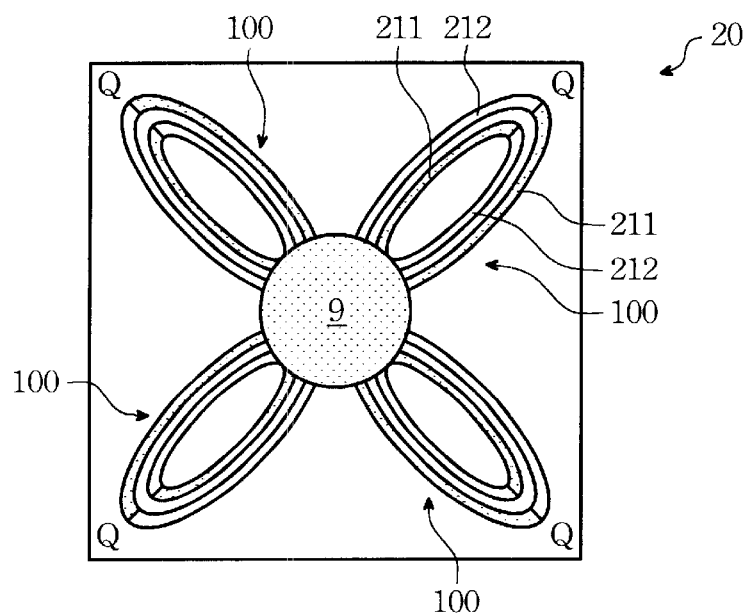
FIG. 7 is a schematic diagram of the channel portion of a seventh embodiment of the thin planar heat distributor in accordance with this invention, in a top view.

Moreover, referring to FIG. 7, which is a schematic diagram of the channel portion 20 of a seventh embodiment of the thin planar heat distributor 1 in accordance with this invention in a top view, the difference between the seventh embodiment and the above-mentioned embodiments lies in that the vapor-diffusing channels 212 and the fluid-conveying channels 211 of the seventh embodiment are constructed by an independence-but-connection manner. The channel portion 20 of this embodiment includes at least two radiative network structures 100 (four radiative network structures 100 are shown in FIG. 7). The fluid-conveying channel 211 and the vapor-diffusing channel 212 are connected at a far end Q of each of the radiative network structures 100. The heat absorbing location is set at the center surrounded by the four radiative network structures 100 (i.e. the fluid concentration region 9 as shown in FIG. 7) further includes corresponding.

The seventh embodiment of this invention, as shown in FIG. 7, can be deemed as a modification of the fourth embodiment, wherein these two embodiments have the fluid-conveying channels 211 and the vapor-diffusing channels 212. In the fourth embodiment as shown in FIG. 4A, the channel 210 is composed by the fluid-conveying channel 211 and the vapor-diffusing channel 212 in a telescoping manner, wherein the fluid-conveying channel 211 is arranged as a sheath of the vapor-diffusing channel 212. In the seventh embodiment as shown in FIG. 7, the fluid-conveying channel 211 and the vapor-diffusing channel 212 are combined, in a manner of "independence arrangement but connection at a far end," to be a part of a radiative network structure 100.

Figure 8:
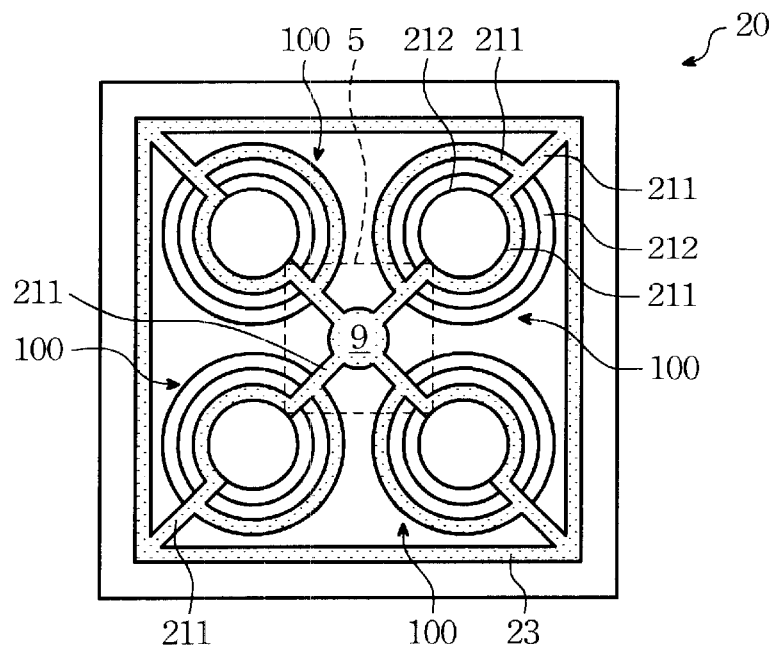
FIG. 8 is a schematic diagram of the channel portion of an eighth embodiment of the thin planar heat distributor in accordance with this invention, in a top view.

Referring to FIG. 8, which is a schematic diagram of the channel portion 20 of an eighth embodiment of the thin planar heat distributor 1 in accordance with this invention in a top view, as the same as the seventh embodiment, the vapor-diffusing channels 212 and the fluid-conveying channels 211 of the eighth embodiment are constructed by an independence-but-connection manner. The channel portion 20 of this embodiment includes a plurality of radiative network structures 100 (four radiative network structures 100 are shown in FIG. 8). In each of the radiative network structures 100, the fluid-conveying channel 211 and the vapor-diffusing channel 212 are connected at two ends thereof so as to form a looped radiative network structure 100, wherein each radiative network structure 100 is apparently located at the radiative fringe in relation to the heat absorbing location of the thin planar heat distributor. As shown in FIG. 8, the heat absorbing location 5 of the eighth embodiment is set at the center surrounded by the four radiative network structures 100 and a fluid concentration region 9 is formed therein. In this invention, the channel portion 20 of the thin planar heat distributor further includes at least one outer ring channel 23 which is disposed at the outer periphery of the four radiative network structures 100 and is used to connect at least two fluid-conveying channels 211 (the outer ring channel 23 shown in FIG. 8 is used to connect all the fluid-conveying channels 211).

In the embodiment of FIG. 8, the outer ring channel 23 is formed by the structure of the fluid-conveying channels 211, that is, the outer ring channel 23 has capillary structures to carry out the fluid capillary transporting function. In a ninth embodiment of this invention as shown in FIG. 9, the outer ring channel 23 is constructed in the same manner as the vapor-diffusing channel 212 so as to connect at least two vapor-diffusing channels 212.

Figure 9:
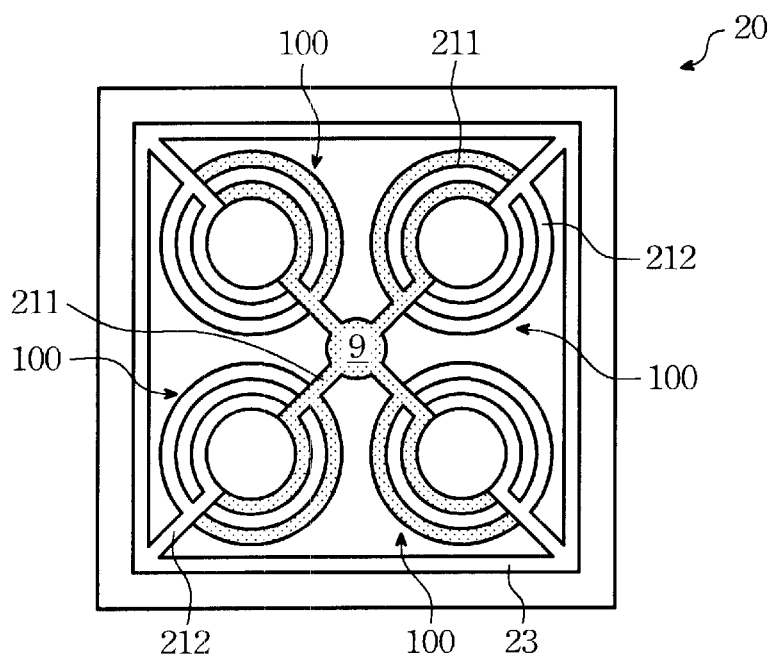
FIG. 9 is a schematic diagram of the channel portion of a ninth embodiment of the thin planar heat distributor in accordance with this invention, in a top view.

In the above-mentioned embodiments of FIGS. 7 to 9, the fluid-conveying channels 211 and the vapor-diffusing channels 212 in the radiative network structure 100 can be in a staggered (i.e. equi-weighting) arrangement (as shown in FIGS. 7 and 8), or be arranged with all the fluid-conveying channels 211 in one side and all the vapor-diffusing channels 212 in the other side (as shown in FIG. 9) or in other similar types of arrangement, depending on working conditions. Similarly, in the practice of this invention, the radiative network structures 100 are unnecessary to be arranged with the same and symmetrical types. For instance, in certain conditions, the outline of the thin planar heat distributor can be designed around or modified according to a particular applied position, and certainly, the arrangement of the fluid-conveying channels 211, the vapor-diffusing channels 212, the radiative network structures 100, and the outer ring channel 23 should also be modified.

In this invention, the design of the outer ring channel 23 can be employed in the thin planar heat distributor having a plurality of radiative network structures 100, such as in the eighth and ninth embodiments. In other examples, the outer ring channel 23 can also be employed in the first to seventh embodiments.

Figure 10:
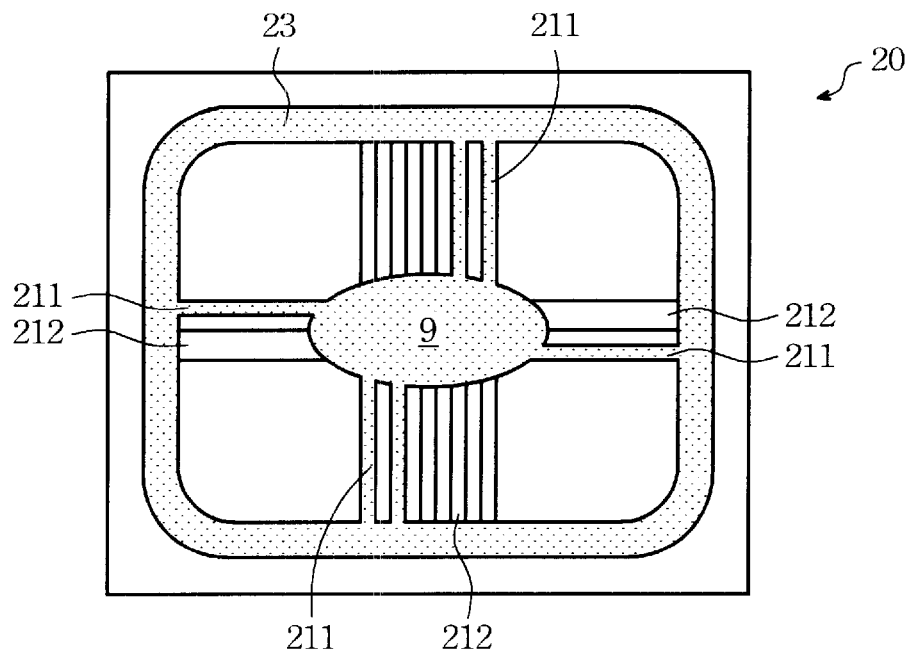
FIG. 10 is a schematic diagram of the channel portion of a tenth embodiment of the thin planar heat distributor in accordance with this invention, in a top view.

Referring to FIG. 10, which is a schematic diagram of the channel portion 20 of a tenth embodiment of the thin planar heat distributor 1 in accordance with this invention in a top view, the vapor-diffusing channels 212 and the fluid-conveying channels 211 are independently arranged, and the outer ring channel 23 having capillary structures are used to connect the ends of each vapor-diffusing channel 212 and each fluid-conveying channel so that the fluids of the channels can interflow.

Figure 11:
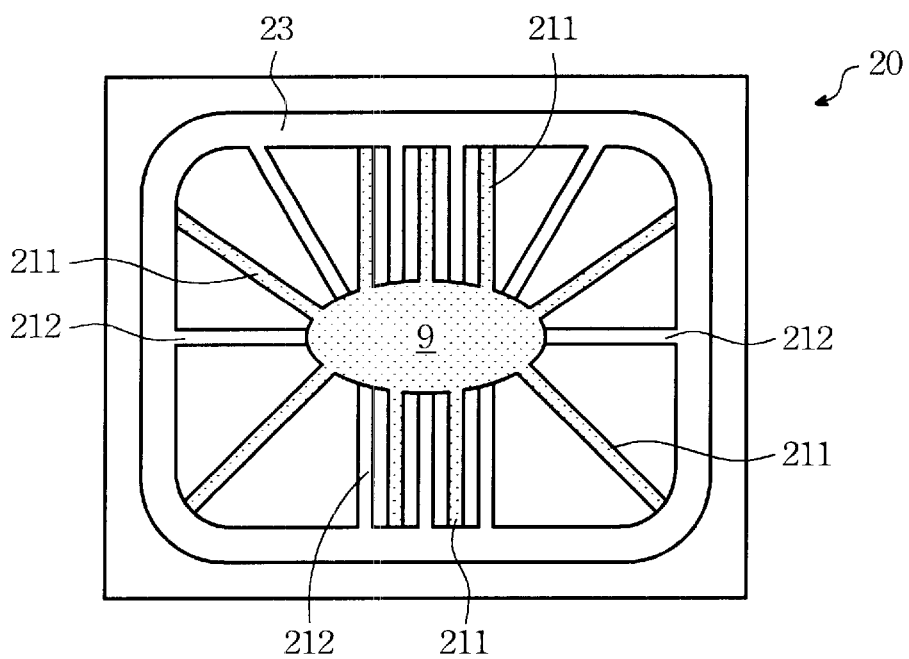
FIG. 11 is a schematic diagram of the channel portion of an eleventh embodiment of the thin planar heat distributor in accordance with this invention, in a top view.

Referring to FIG. 11, which is a schematic diagram of the channel portion 20 of an eleventh embodiment of the thin planar heat distributor 1 in accordance with this invention in a top view, the difference between the eleventh embodiment and the tenth embodiment lies in that the vapor-diffusing channels 212 and the fluid-conveying channels 211 are both independently arranged and spaced, and the outer ring channel 23 having capillary structures for connecting the ends of each vapor-diffusing channel 212 and each fluid-conveying channel is constructed in the same manner as the vapor-diffusing channel 212.

Figure 12:
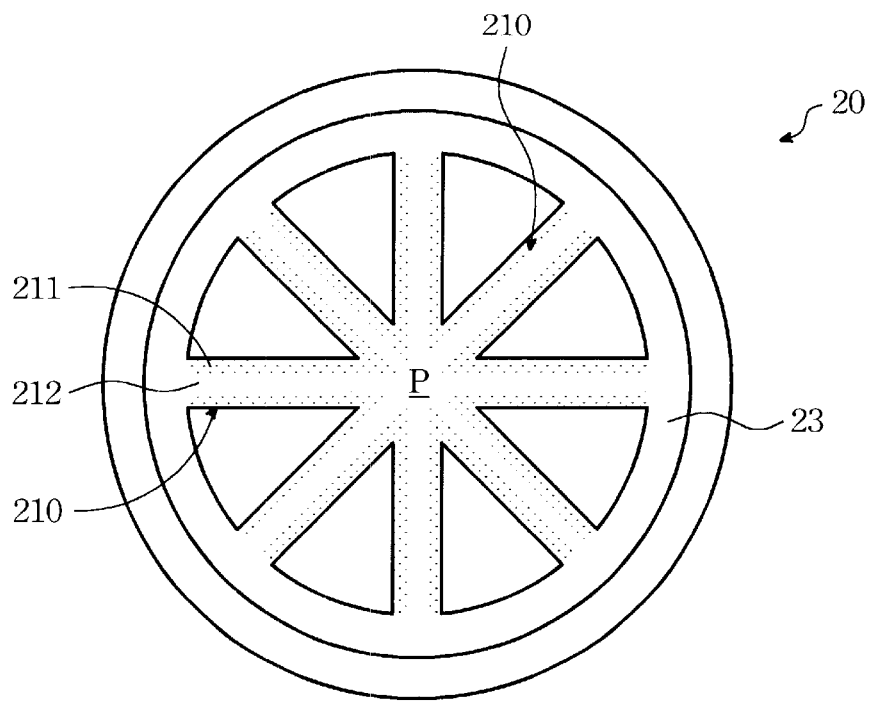
FIG. 12 is a schematic diagram of the channel portion of a twelfth embodiment of the thin planar heat distributor in accordance with this invention, in a top view.

Referring to FIG. 12, which is a schematic diagram of the channel portion 20 of a twelfth embodiment of the thin planar heat distributor 1 in accordance with this invention in a top view, the difference between the twelfth embodiment and the tenth, eleventh embodiment lies in that the vapor-diffusing channels 212 and the fluid-conveying channels 211 are arranged in the same manner as the channel 210 of the first embodiment, that is, the vapor-diffusing channels 212 are constructed in the fluid-conveying channels 211, and the outer ring channel 23 is constructed in the same manner as the vapor-diffusing channel 212.

In this invention, the shape of the thin planar heat distributor can be square (such as the first to eleventh embodiments), circular (such as the twelfth embodiment) or other usable shapes.

Figure 13:
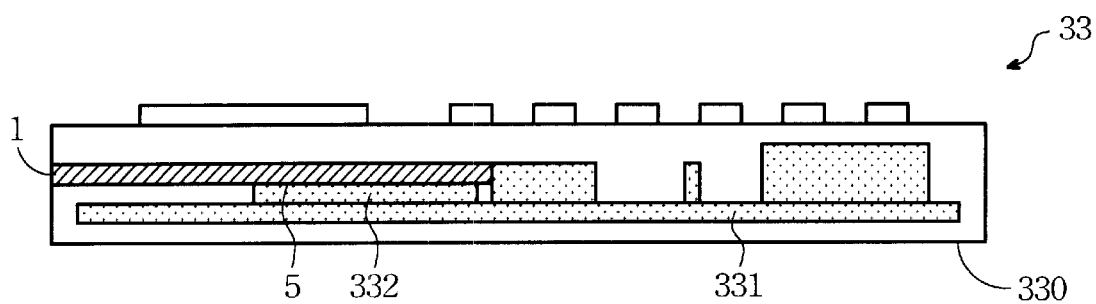
FIG. 13 is a schematic diagram illustrating an embodiment of the thin planar heat distributor of this invention applied in an ultra electronic apparatus.

Please refer to FIG. 13, which is a schematic diagram of the thin planar heat distributor 1 of this invention applied in an ultra electronic apparatus 33. A heat producing component 332 on a printed circuit board 331 inside the apparatus housing 330 is directly set at the heat absorbing location 5 of the thin planar heat distributor 1, wherein the heat absorbing location 5 is practiced in an eccentric mode of the third embodiment), thereby the heat produced by the heat producing component 332 can be rapidly transported to the edges of the housing 330 to dissipate. Moreover, since the structure of this invention can be fabricated with a thin thickness, the inner structural space of the electronic apparatus 33 is less influenced.

Figure 14:
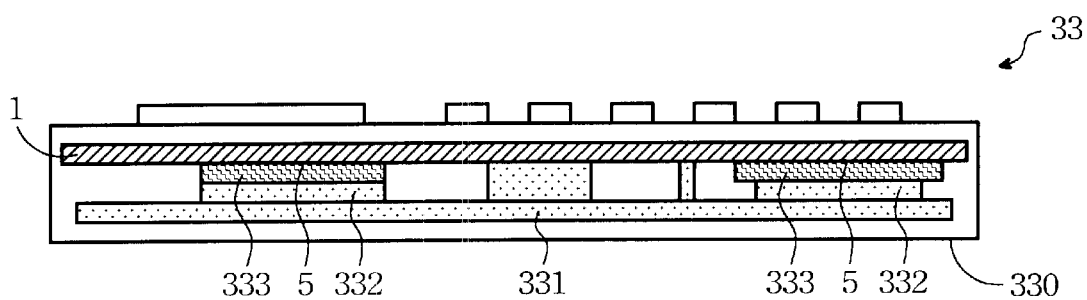
FIG. 14 is a schematic diagram illustrating another embodiment of the thin planar heat distributor of this invention applied in an ultra electronic apparatus.

Please refer to FIG. 14, which is a schematic diagram illustrating another embodiment of the thin planar heat distributor 1 of this invention applied in an ultra electronic apparatus 33. Two heat producing components 332 on a printed circuit board 331 are indirectly set at the respective heat absorbing locations 5 of the thin planar heat distributor 1 through two intermediate heat conducting blocks 333 for carrying out the heat exchange operation, wherein the two heat absorbing locations 5 are practiced in the same mode as the sixth embodiment), thereby the heat produced by the heat producing component 332 can be rapidly dissipated. In the other embodiments, the heat conducting blocks 333 can be replaced by partial bending of the heat distributor 1 of this invention since the thickness of the heat distributor 1 is extremely thin to have a good bending effect. Moreover, since the capillary structure is employed, the fluid transporting effect of the fluid-conveying channels 211 will not be affected under the bending condition.

Figure 15:
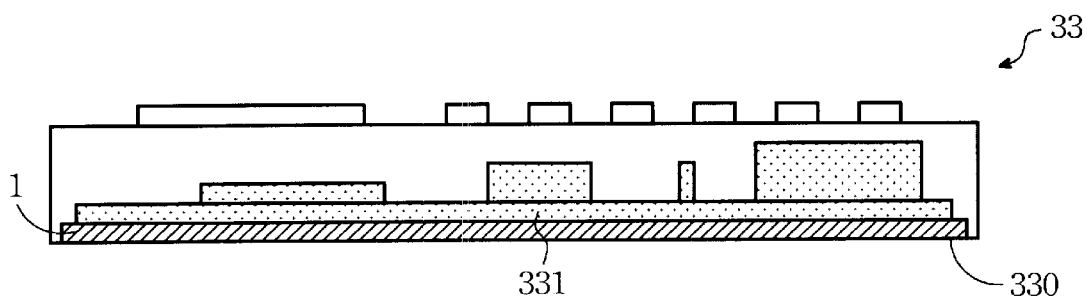
FIG. 15 is a schematic diagram illustrating a further embodiment of the thin planar heat distributor of this invention applied in an ultra electronic apparatus.

Please refer to FIG. 15, which is a schematic diagram illustrating a further embodiment of the thin planar heat distributor 1 of this invention applied in an ultra electronic apparatus 33. The thin planar heat distributor 1 is directly set at the bottom of the printed circuit board 331. Since the thickness of the heat distributor 1 is extremely thin, the arrangement of the other components of the housing 330 will not be affected.

In this invention, the channel portion 20 of the thin planar heat distributor 1 can be a copper foil, an aluminum foil or other heat conducting thin metallic sheet. The overlapping part 10 can be a copper foil, an aluminum foil, a metallic sheet, a housing sheet (on which the channel portion 20 is directly stuck), or other planar structures being able to seal the top channel surface 21 of the channel portion 20.

In this invention, the channel portion 20 of the thin planar heat distributor 1 can be fabricated by etching, electroplating, punching, casting, cutting or other methods suitable for forming channels on a thin plate.

In this invention, the capillary structure 30 in the fluid-conveying channels 211 of the channel portion 20 of the thin planar heat distributor 1 can be a sintering article of metallic powders, a ceramic water-absorbing article or other porous materials being able to providing a capillary transporting function.

In the aforesaid embodiments of this invention, the thin planar heat distributor 1 is practiced in a manner of a single piece. However, the thin planar heat distributor 1 can also be practiced in a manner of a loop.

Figure 16:
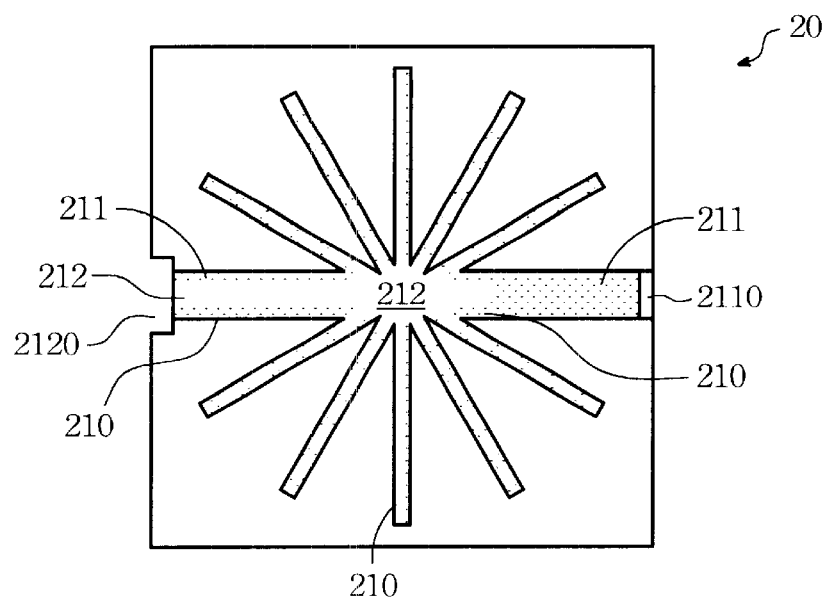
FIG. 16 is a schematic diagram of the channel portion of a thirteenth embodiment of the thin planar heat distributor in accordance with this invention, in a top view.

Referring to FIG. 16, which is a schematic diagram of the channel portion 20 of a thirteenth embodiment of the thin planar heat distributor 1 in accordance with this invention in a top view, the major structural difference between the thirteenth embodiment and the first embodiment resides in that the channel portion 20 further includes a fluid-conveying channel entrance 2110 in connection with at least one of the fluid-conveying channels 211 of the channel 210

(In FIG. 16, the fluid-conveying channel entrance 2110 is connected with a larger fluid-conveying channel 211) and a vapor-diffusing channel entrance 2120 in connection with at least one of the vapor-diffusing channels 212 of the channel 210. By means of the fluid-conveying channel entrance 2110 and the vapor-diffusing channel entrance 2120, a plurality of the thin planar heat distributors of this invention can be employed to make a convenient heat dissipating combination.

Figure 17:
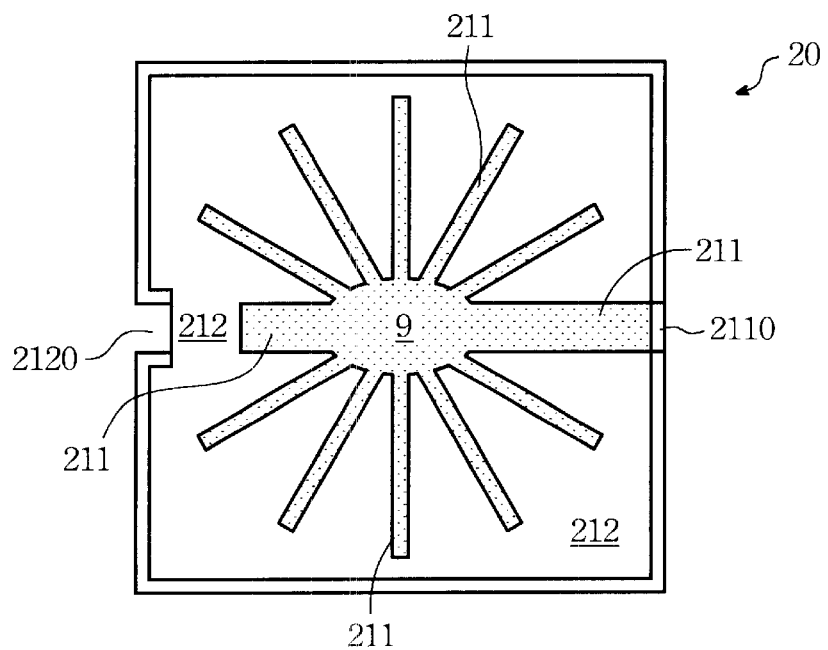
FIG. 17 is a schematic diagram of the channel portion of a fourteenth embodiment of the thin planar heat distributor in accordance with this invention, in a top view.

Referring to FIG. 17, which is a schematic diagram of the channel portion 20 of a fourteenth embodiment of the thin planar heat distributor 1 in accordance with this invention in a top view, the major structural difference between the thirteenth embodiment and the fifth embodiment resides in that the channel portion 20 further includes a fluid-conveying channel entrance 2110 in connection with at least one of the fluid-conveying channels 211 (In FIG. 17, the fluid-conveying channel entrance 2110 is connected with a larger fluid-conveying channel 211) and a vapor-diffusing channel entrance 2120 in connection with at least one of the. vapor-diffusing channels 212. By means of the fluid-conveying channel entrance 2110 and the vapor-diffusing channel entrance 2120, a plurality of the thin planar heat distributors of this invention can be employed to make a convenient heat dissipating combination.

Figure 18:
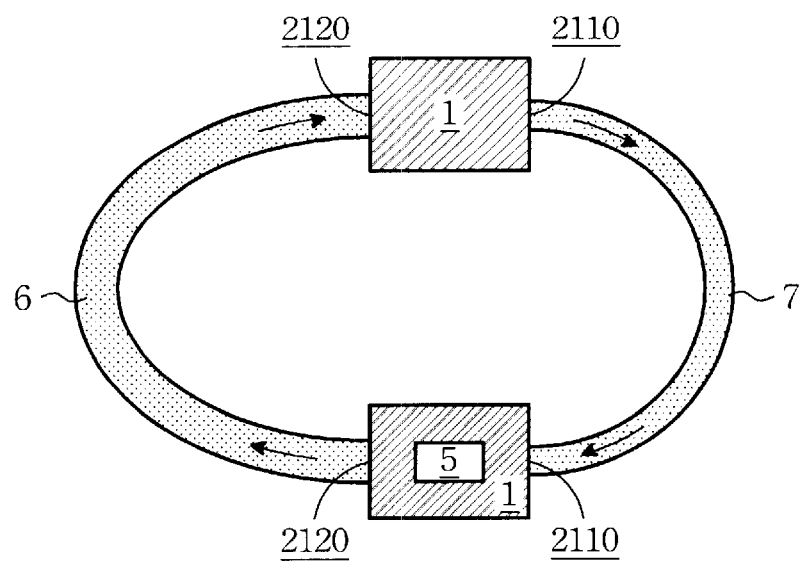
FIG. 18 is an embodiment of employing the thin planar heat distributors of this invention.

Please refer to FIG. 18, which is a heat dissipating combination employing the thin planar heat distributors having the channel entrances of the thirteenth or fourteenth embodiment. The heat dissipating combination as shown in FIG. 18 includes two thin planar heat distributors 1. The two fluid-conveying channel entrances 2110 of the two thin planar heat distributors 1 are connected with each other by a fluid return channel 7 and the two vapor-diffusing channel entrance 2120 thereof are connected with each other by a vapor duct 6, thereby the vapor and fluid of one pair of the thin planar heat distributors 1 can interflow. As shown in FIG. 18, the heat absorbing location 5 of the lower thin planar heat distributor 1 can be employed as a heat absorbing article in this heat dissipating combination, and the upper thin planar heat distributor 1 can be employed as a means for heat dissipation. Certainly, in another employment, the two thin planar heat distributors 1 can also be respectively disposed on the corresponding heat producing components.

Basically, the heat dissipating combination of this invention includes at least one pair of thin planar heat distributors 1, wherein the corresponding two fluid-conveying channel entrances 2110 in each pair of the thin planar heat distributors 1 are connected with each other by a fluid return channel 7 and the corresponding two vapor-diffusing channel entrance 2120 thereof are connected with each other by a vapor duct 6, thereby the vapor and fluid of each pair of the thin planar heat distributors 1 can interflow.

Figure 19:
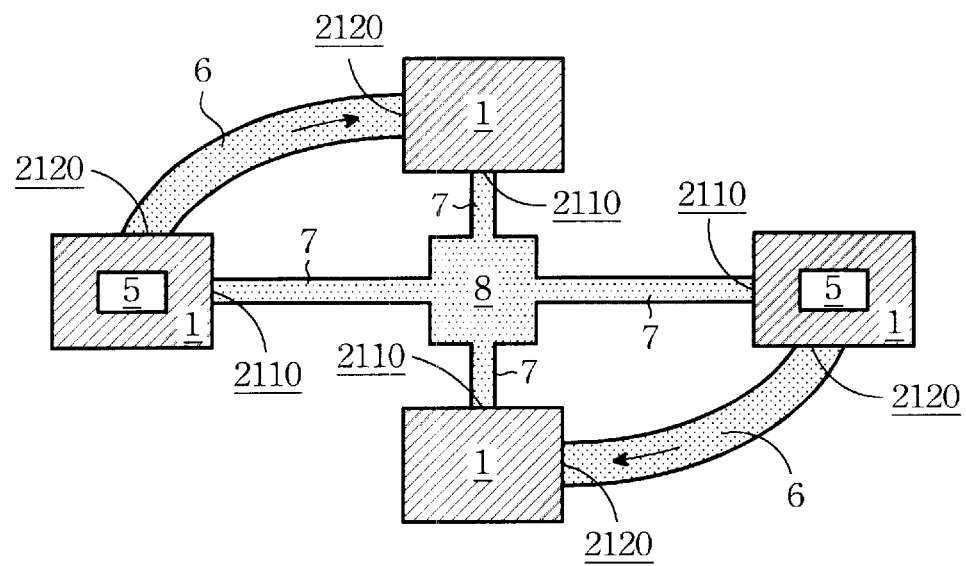
FIG. 19 is another embodiment of employing the thin planar heat distributors of this invention.

Please refer to FIG. 19, which is a schematic diagram of another heat dissipating combination of this invention, wherein the heat dissipating combination includes two pairs of the thin planar heat distributors 1 and the fluid return channels 7 of these two pairs of the thin planar heat distributors 1 are intersected to form a fluid co-reservoir 8 of this heat dissipating combination.

In the heat dissipating combination of this invention, the vapor duct 6 for connecting the two vapor-diffusing channel entrances 2120 is preferably an adiabatic duct structure, thereby to maintain the transporting pressure of the vapor in the duct.

In the heat dissipating combination of this invention, the fluid return channel 7 for connecting the two fluid-conveying channel entrances 2110 preferably has a capillary structure therein. The capillary structure is preferably a sintering article of metallic powders. Certainly, the fluid co-reservoir 8 is preferably constructed by a capillary structure block.

Figure 20A:
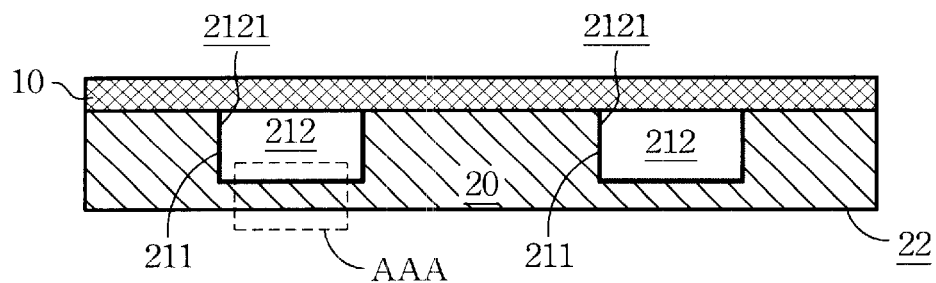
FIG. 20A is another schematic section view of FIG. 1A along a sectional line aa.
Figure 20B:
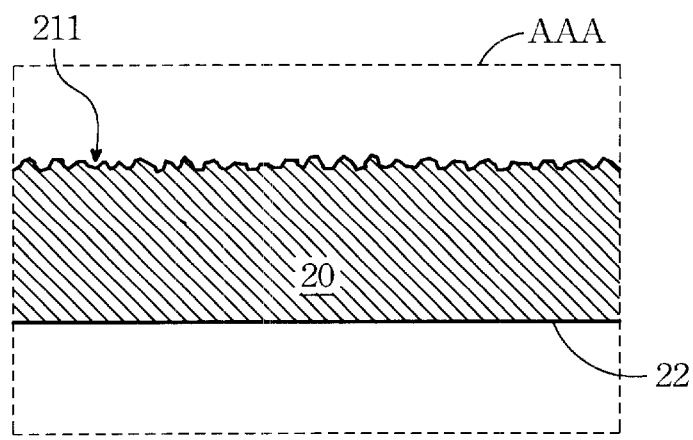
FIG. 20B is a schematic enlarged view of the AAA dotted region in FIG. 20A.

In this invention, the capillary structure employed in the fluid-conveying channel 211 is preferably constructed by porous materials. However, in other employments as shown in FIGS. 20A and 20B, the capillary structure of the fluid-conveying channel 211 can also be constructed by roughening the wall 2121 of the vapor-diffusing channel 212. By means of the formed micro-indenting and protruding structures and the liquid adhesion, the liquid fluid is transported.

In the above-mentioned embodiments of this invention, the outer ring channel 23 is apparently arranged to be co-used by the fluid-conveying channels 211, the vapor-diffusing channels 212 and the channels 210. However, connecting part of channels by one outer ring channel 23, or arranging more outer ring channels 23 can also be practiced.

In the above-mentioned embodiments of this invention, the outer ring channel 23, the fluid-conveying channel 211 and the vapor-diffusing channels 212 the channel 210 can be respectively replaced by the channel 210 having both functions of transporting liquid and vapor, without greatly affecting the function of the original thin planar heat distributor 1.

Figure 21:
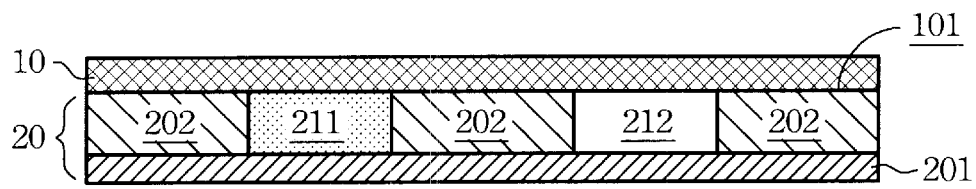
FIG. 21 is a schematic sectional view illustrating another material arrangement of the thin planar heat distributor in accordance with this invention.

In this invention, the channel portion 20 and the overlapping part 10 of each of the above-mentioned embodiments are respectively processed with one sheet. However, in other practices, the channel portion 20 and the overlapping part 10 can also be processed with more sheets and then be assembled as a whole. For instance, as shown in FIG. 21, the channel portion 20 is constructed by a bottom sheet 201 stacked with a clipping sheet 202. Such a construction can facilitate the fabrication of the clipping sheet 202 with a more convenient manner such as punch processing.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A thin planar heat distributor, comprising:
    a channel portion, which is a foil-like plate having a top channel surface and a corresponding outer face, wherein a plurality of channels in a predetermined radiative arrangement are formed by a manufacturing manner on said top channel surface of said channel portion, and each of said channels further includes a fluid-conveying channel in which a capillary structure is set and a vapor-diffusing channel disposed in said fluid-conveying channel, and the intersection of said channels in said predetermined radiative arrangement is a heat absorption location; and
    an overlapping part, by which said top channel surface of said channel portion is sealed so that said channels in said channel portion form together to be a closed radiative channel network structure;
    wherein a certain quantity of volatile fluid is added in said closed channel network structure; when a heat producing component is set at said heat absorption location of said thin planar heat distributor, the heat produced by said heat producing component is absorbed by said channel portion, and the absorbed heat evaporates the fluid to form a vapor which is transported away from said heat absorption location through said vapor-diffusing channels, and said vapor far away from said heat absorption location releases the heat to be condensed to form a liquid which is transported back to said heat absorption location by means of said capillary structures in said fluid-conveying channels.

2. The thin planar heat distributor of claim 1, wherein said capillary structure is a porous material.

3. The thin planar heat distributor of claim 1, wherein said capillary structure is a surface by a roughening treatment.

4. The thin planar heat distributor of claim 1, wherein a capillary structure block is accumulated at said heat absorption location to construct a fluid concentration region of said fluid-conveying channels.

5. The thin planar heat distributor of claim 1, wherein said predetermined radiative arrangement includes at least one radiative network structure, and each radiative network structure further includes corresponding channels and the intersection of said fluid-conveying channels in each radiative network structure is said heat absorbing location.

6. The thin planar heat distributor of claim 5, wherein each of said radiative network structures is at least connected with another radiative network structure by at least one of said channels.

7. The thin planar heat distributor of claim 1, wherein said channel portion further includes at least one outer ring channel which is disposed outside said heat absorbing location and is used to connect at least two of said channels.

8. A thin planar heat distributor, comprising:
 a channel portion, which is a foil-like plate having a top channel surface and a corresponding outer face, wherein a plurality of fluid-conveying channels and vapor-diffusing channels in a predetermined radiation-and-interval arrangement are formed by a manufacturing manner on said top channel surface of said channel portion, and a corresponding capillary structure is set at each of said fluid-conveying channels, and the intersection of said fluid-conveying channels in said predetermined radiation-and-interval arrangement is a heat absorption location; and
 an overlapping part, by which said top channel surface of said channel portion is sealed so that said fluid-conveying channels and said vapor-diffusing channels in said channel portion form together to be a closed radiative channel network structure;
wherein a certain quantity of volatile fluid is added in said closed channel network structure; when a heat producing component is set at said heat absorption location of said thin planar heat distributor, the heat produced by said heat producing component is absorbed by said channel portion, and the absorbed heat evaporates the fluid to form a vapor which is transported away from said heat absorption location through said vapor-diffusing channels, and said vapor far away from said heat absorption location releases the heat to be condensed to form a liquid which is transported back to said heat absorption location by means of said capillary structures in said fluid-conveying channels.

9. The thin planar heat distributor of claim 8, wherein a capillary structure block is accumulated at said heat absorption location to construct a fluid concentration region of said fluid-conveying channels.

10. The thin planar heat distributor of claim 8, wherein said predetermined radiation-and-interval arrangement includes at least one radiative network structure, and each radiative network structure further includes corresponding fluid-conveying channels and vapor-diffusing channels and the intersection of said fluid-conveying channels in each radiative network structure is said heat absorbing location.

11. The thin planar heat distributor of claim 10, wherein each of said radiative network structures is at least connected with another radiative network structure by at least one of said fluid-conveying channels.

12. The thin planar heat distributor of claim 10, wherein said channel portion further includes at least one outer ring channel which is disposed outside said heat absorbing location and is used to connect at least two of said fluid-conveying channels.

13. The thin planar heat distributor of claim 8, wherein said channel portion further includes at least one outer ring channel which is disposed outside said heat absorbing location and is used to connect at least two of said vapor-diffusing channels.

14. A thin planar heat distributor, comprising:
 a channel portion, which is a foil-like plate having a top channel surface and a corresponding outer face, wherein a plurality of fluid-conveying channels and vapor-diffusing channels in a predetermined radiation-and-interval arrangement are formed by a manufacturing manner on said top channel surface of said channel portion, and a corresponding capillary structure is set at each of said fluid-conveying channels, and the intersection of said fluid-conveying channels in said predetermined radiation-and-interval arrangement is a heat absorption location, and said channel portion further includes a fluid-conveying channel entrance in connection with at least one of said fluid-conveying channels and a vapor-diffusing channel entrance in connection with at least one of said vapor-diffusing channels; and
 an overlapping part, by which said top channel surface of said channel portion is sealed so that said fluid-conveying channels and said vapor-diffusing channels in said channel portion form together to be a radiative channel network structure which is a closed radiative channel network structure except said fluid-conveying channel entrance and said vapor-diffusing channel entrance.

15. The thin planar heat distributor of claim 14, wherein a capillary structure block is accumulated at said heat absorption location to construct a fluid concentration region of said fluid-conveying channels.

16. The thin planar heat distributor of claim 14, wherein said predetermined radiation-and-interval arrangement includes at least one radiative network structure, and each radiative network structure further includes corresponding fluid-conveying channels and vapor-diffusing channels and the intersection of said fluid-conveying channels in each radiative network structure is said heat absorbing location.

17. The thin planar heat distributor of claim 16, wherein each of said radiative network structures is at least connected with another radiative network structure by at least one of said fluid-conveying channels.

18. The thin planar heat distributor of claim 14, wherein said vapor-diffusing channel entrance is externally connected with a vapor duct so as to be in connection with a vapor-diffusing channel entrance of another thin planar heat distributor.

19. The thin planar heat distributor of claim 14, wherein said fluid-conveying channel entrance is externally connected with a fluid return channel so as to be in connection with a fluid-conveying channel entrance of another thin planar heat distributor.

20. The thin planar heat distributor of claim 14, wherein said fluid-conveying channel entrance is externally connected with a fluid return channel so as to be in connection with a co-reservoir.

\* \* \* \* \*